(12) United States Patent
Chuang

(10) Patent No.: US 9,813,816 B2
(45) Date of Patent: Nov. 7, 2017

(54) AUDIO PLUG DETECTION STRUCTURE IN AUDIO JACK CORRESPONDING TO AUDIO PLUG AND METHOD THEREOF

(71) Applicant: REALTEK SEMICONDUCTOR CORP., Hsinchu (TW)

(72) Inventor: Tsung-Peng Chuang, Jhubei (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 118 days.

(21) Appl. No.: 14/677,643

(22) Filed: Apr. 2, 2015

(65) Prior Publication Data

US 2016/0216303 A1 Jul. 28, 2016

(30) Foreign Application Priority Data

Jan. 26, 2015 (TW) .............................. 104102502 A

(51) Int. Cl.
*G01R 29/027* (2006.01)
*H04R 5/04* (2006.01)
*G01R 31/04* (2006.01)

(52) U.S. Cl.
CPC ............. *H04R 5/04* (2013.01); *G01R 31/043* (2013.01); *H04R 2420/05* (2013.01)

(58) Field of Classification Search
None
See application file for complete search history.

(56) References Cited

U.S. PATENT DOCUMENTS

2012/0019309 A1* 1/2012 Turner ................. H03K 5/1254
327/524
2013/0158919 A1* 6/2013 Shah .................... H04R 5/04
702/64
2014/0219463 A1* 8/2014 Poulsen .................. H04R 5/04
381/58
2014/0241535 A1* 8/2014 Poulsen .................. H04R 5/04
381/58
2015/0349464 A1* 12/2015 Hogan ............... H01R 13/7039
439/620.21

FOREIGN PATENT DOCUMENTS

TW        M-383236 U1    6/2010
TW        201312874 A    3/2013
TW        1450456 B      8/2014

* cited by examiner

*Primary Examiner* — Jermele M Hollington
*Assistant Examiner* — Douglas X Rodriguez
(74) *Attorney, Agent, or Firm* — Muncy, Geissler, Olds & Lowe, P.C.

(57) ABSTRACT

An audio plug detection structure is disclosed, which is adapted for an audio jack corresponding to an audio plug and includes a first and second connection points, a time-varying signal generation circuit, and a comparison circuit. The time-varying signal generation and comparison circuits are connected to the first connection point. When the audio plug is inserted into the audio jack, the first connection point is connected to a first pole of the audio plug and the second connection point is connected to a second pole different from the first pole of the audio plug. Therefore, the time-varying signal generation circuit, the first connection point, an inner impedance circuit of the audio plug and the second connection plug form a loop. The comparison circuit outputs a determination signal indicating the audio plug is inserted by detecting a change of a time-varying signal generated by the time-varying signal generation circuit.

12 Claims, 8 Drawing Sheets ically the same as the voltage provided by the voltage source VDD is input into the detection terminal JD. After the audio plug 20 is inserted into the audio jack 10, the detection connection point 15 and the first connection point 11 are closed by the metal material of the first pole point 21, and the voltage input into the detection terminal JD is pulled down, which can be used to determine that the audio plug 20 has been inserted into the audio jack 10.

AUDIO PLUG DETECTION STRUCTURE IN AUDIO JACK CORRESPONDING TO AUDIO PLUG AND METHOD THEREOF

CROSS-REFERENCE TO RELATED APPLICATION

This application claims priority from Taiwan Patent Application No. 104102502, filed on Jan. 26, 2015, in the Taiwan Intellectual Property Office, the content of which are hereby incorporated by reference in their entirety for all purposes.

BACKGROUND OF THE INVENTION

1. Field of the Invention

This application relates to an audio plug detection structure and method thereof, and more particularly, to an audio plug detection structure and method thereof by utilizing a time-varying signal as a detection signal.

2. Description of the Related Art

When an audio plug, such as a 3-pole audio plug or a 4-pole audio plug, is inserted into a corresponding audio jack, the audio jack needs to have a function to detect the audio plug in order to appropriately adjust the audio signal output. In other words, the audio signal output can remain low when the audio plug is not inserted into the audio jack, and switch to an appropriate output mode when the condition that the audio plug is inserted into the audio jack is confirmed, which can lower the electricity consumption in circuit and reduce the cost.

To detect the state whether the audio plug is inserted into the audio jack or not, an elastic and conductive connection point connected a power source can be disposed at the inside of the audio jack. The elastic and conductive connection point also corresponds to a ground terminal. When the audio plug is not inserted into the audio jack yet, the elastic and conductive connection point and the ground terminal are open. When the audio plug is being inserted into the audio jack, the frond end of the audio plug presses the elastic and conductive connection point to make it be in contact the ground terminal, and thus the elastic and conductive connection point and the ground terminal are closed and a current can flow therebetween. According to such current or a voltage variation relating to such current, whether or not the audio plug is inserted into the audio jack can be detected. However, this method cannot tell if the inserted object is the audio plug. For example, when a plug of a cell phone strap or a dust plug is inserted into the audio jack, the elastic and conductive connection point is still pressed and the generated current may cause a mistake.

Therefore, a typical method is to dispose a detection circuit with the connection point for detection on the audio jack. Please refer to FIG. 1, which shows the structure of a typical audio jack. In FIG. 1, the audio plug 20 includes four pole points, a first pole point 21, a second pole point 22, a third pole point 23, and a fourth pole point 24. After the audio plug 20 is inserted into an audio jack 10, the first pole point 21, the second pole point 22, the third pole point 23, and the fourth pole point 24 are connected to a left channel output terminal HP_L, a right channel output terminal HP_R, a ground terminal, and a microphone input terminal MIC_IN of an audio chip 30 via a first connection point 11, a second connection point 12, a third connection point 13, and a fourth connection point 14 of the audio jack, respectively. There is a detection connection point 15 disposed at a position opposite to the first connection point 11 inside the audio jack 10. The detection connection point 15 is connected to a detection terminal JD of the aforementioned audio chip 30 as well as a DC voltage source VDD. Specifically, before the audio plug 20 is inserted into the audio jack 10, the detection connection point 15 and the first connection point 11 are open, where a high voltage substantially the same as the voltage provided by the voltage source VDD is input into the detection terminal JD. After the audio plug 20 is inserted into the audio jack 10, the detection connection point 15 and the first connection point 11 are closed by the metal material of the first pole point 21, and the voltage input into the detection terminal JD is pulled down, which can be used to determine that the audio plug 20 has been inserted into the audio jack 10.

However, in both the above described methods, there are connection points disposed inside the audio jack and specifically used to detect whether or not the audio plug is inserted into the audio jack. Those connection points and the circuits connected thereto occupy extra space in the whole circuit, and the flexibility for circuit or device structure design may decrease. Besides, the aforementioned structures or methods require a DC voltage source connected to the detection connection point, and the electricity consumption may increase and cause the cost increasing as well.

SUMMARY OF THE INVENTION

In view of the aforementioned technical problems, the objective of the present invention provides an audio plug detection structure and the method thereof, which can detect whether or not the audio plug is inserted into an audio jack without using an extra connection point.

According to one objective of the present invention, an audio plug detection structure is provided, which is adapted for an audio jack corresponding to an audio plug. The audio plug detection structure includes a plurality of connection points, a time-varying signal generation circuit, and a comparison circuit. The plurality of connection points are disposed on an inside of the audio jack, and one-to-one or multiple-to-one connected to a plurality of pole points of the audio plug when the audio plug is inserted into the audio jack. Each of the plurality of connection points is connected to a functional circuit or a chip pin corresponding to each of the plurality of pole points of the audio plug or a ground terminal. The plurality of connection points include a first connection point and a second connection point. When the audio plug is inserted into the audio jack, the first connection point is connected to a first pole point of the plurality of pole points, and the second connection point is connected to a second pole point of the plurality of pole points. The time-varying signal generation circuit is connected to the first connection point and outputs a time-varying signal. The comparison circuit is connected to the first connection point, receives the time-varying signal, and compares the time-varying signal with a reference signal. When the audio plug is inserted into the audio jack, the time-varying signal generation circuit, the first connection point, an inside impedance circuit of the audio plug, and the second connection point form a loop, and the comparison circuit outputs a determination signal to determine the audio plug is inserted into the audio jack by comparing a variation of the time-varying signal with the reference signal.

Preferably, the time-varying signal may be a square wave signal, and a duty cycle of the square wave signal may be modulatable.

Preferably, the audio plug detection structure may further include a time control circuit. The time control circuit is connected to an output terminal of the comparison circuit and the time-varying signal generation circuit. The time control circuit controls the duty cycle, generates a latch signal according to a feedback signal from the time-varying signal generation circuit, and when the time-varying signal is high, samples the determination signal outputted from the comparison circuit according to the latch signal.

Preferably, the audio plug detection structure may further include a first switch and a second switch. The first switch includes a first terminal, a second terminal, and a first control terminal. The first terminal is connected to the first connection point, the second terminal is connected to the time-varying signal generation circuit and the comparison circuit, and the first control terminal is connected to the comparison circuit. The second switch includes a third terminal, a fourth terminal, and a second control terminal. The third terminal is connected to the first connection point, the fourth terminal is connected to the functional circuit or the chip pin corresponding to the first pole point or the ground terminal, and the second control terminal connected to the comparison circuit. After a predetermined time since the determination signal is outputted, the comparison circuit outputs a switch signal. The first terminal and the second terminal of the first switch are open according to the switch signal. The third terminal and the fourth terminal of the second switch are closed according to the switch signal.

Preferably, with relation to the other connection points, the first connection point may be disposed at an innermost side of the inside of the audio jack.

Preferably, the second connection point is connected to the ground terminal.

According to another objective of the present invention, an audio plug detection method is provided, which is adapted for an audio jack corresponding to an audio plug. The audio detection method includes providing a plurality of connection points to an inside of an audio jack, wherein the plurality of connection points are one-to-one or multiple-to-one connected to a plurality of pole points of the audio plug when the audio plug is inserted into the audio jack, each of the plurality of connection points is connected to a functional circuit or a chip pin corresponding to each of the plurality of pole points of the audio plug or a ground terminal, the plurality of connection points comprise a first connection point and a second connection point, and when the audio plug is inserted into the audio jack, the first connection point is connected to a first pole point of the plurality of pole points, and the second connection point is connected to a second pole point of the plurality of pole points; connecting a time-varying signal generation circuit outputting a time-varying signal to the first connection point; connecting a comparison circuit to the first connection point and the time-varying signal generation circuit to make the comparison circuit receive the time-varying signal; comparing the time-varying signal with a reference signal by the comparison circuit; forming a loop by the time-varying signal generation circuit, the first connection point, an inside impedance circuit of the audio plug, and the second connection point when the audio plug is inserted into the audio jack; and outputting a determination signal to determine the audio plug is inserted into the audio jack from the comparison circuit by comparing a variation of the time-varying signal with the reference signal.

Preferably, the time-varying signal may be a square wave signal, and a duty cycle of the square wave signal may be modulatable.

Preferably, the audio plug detection method may further include connecting a time control circuit to the time-varying signal generation circuit and an output terminal of the comparison circuit; controlling the duty cycle by the time control circuit; generating a latch signal by the time control circuit according to a feedback signal from the time-varying signal generation circuit; sampling the determination signal outputted from the comparison circuit by the time control circuit according to the latch signal.

Preferably, the audio plug detection method may further include connecting a first terminal of a first switch to the first connection point; connecting a second terminal of the first switch to the time-varying signal generation circuit and the comparison circuit; connecting a first control terminal of the first switch to the comparison circuit; connecting a third terminal of a second switch to the first connection point; connecting a fourth terminal of the second switch to the functional circuit or the chip pin corresponding to the first pole point or the ground terminal; connecting a second control terminal of the second switch to the comparison circuit; outputting a switch signal by the comparison circuit after a predetermined time since the determination signal is outputted; opening the first terminal and the second terminal of the first switch according to the switch signal; and closing the third terminal and the fourth terminal of the second switch according to the switch signal.

Preferably, with relation to the other connection points, the first connection point may be disposed at an innermost side of the inside of the audio jack.

Preferably, the second connection point is connected to the ground terminal.

As mentioned above, the audio plug detection structure and in accordance with the present invention may have one or more advantages as follows.

1. The audio plug detection structure in accordance with the present invention is able to use the time-varying signal as a signal for detecting whether or not the audio plug is inserted into the audio jack so as to use the inside impedance circuit of the audio plug to form a loop without adding an extra connection point for detection.

2. The audio plug detection structure in accordance with the present invention is able to use the modulatable square wave signal as a signal for detecting whether or not the audio plug is inserted into the audio jack so as to optimize the accuracy of the detection and reduce the electricity consumption of the whole circuit.

3. The audio plug detection structure in accordance with the present invention is able to separate the detection circuit and the functional circuit corresponding to the audio plug (e.g., a left channel output terminal, a right channel output terminal or a microphone input terminal) by the switches controlled by the switch signal from the comparison circuit so as to prevent the interference between two different circuits.

BRIEF DESCRIPTION OF THE DRAWINGS

Hereinafter, embodiments of the present invention will be described in detail with reference to the accompanying drawings so that those skilled in the art to which the present invention pertains can realize the present invention, wherein.

DETAILED DESCRIPTION OF THE PREFERRED EMBODIMENTS

Hereinafter, embodiments of the present invention will be described in detail with reference to the accompanying drawings so that those skilled in the art to which the present invention pertains can realize the present invention. As those skilled in the art would realize, the described embodiments may be modified in various different ways, all without departing from the spirit or scope of the present invention.

It will be understood that, although the terms first, second, third, etc., may be used herein to describe various elements, these elements should not be limited by these terms. These terms are only used to distinguish one element from another element. Thus, a first element could be termed a second element without departing from the teachings of the invention.

Figure 2:
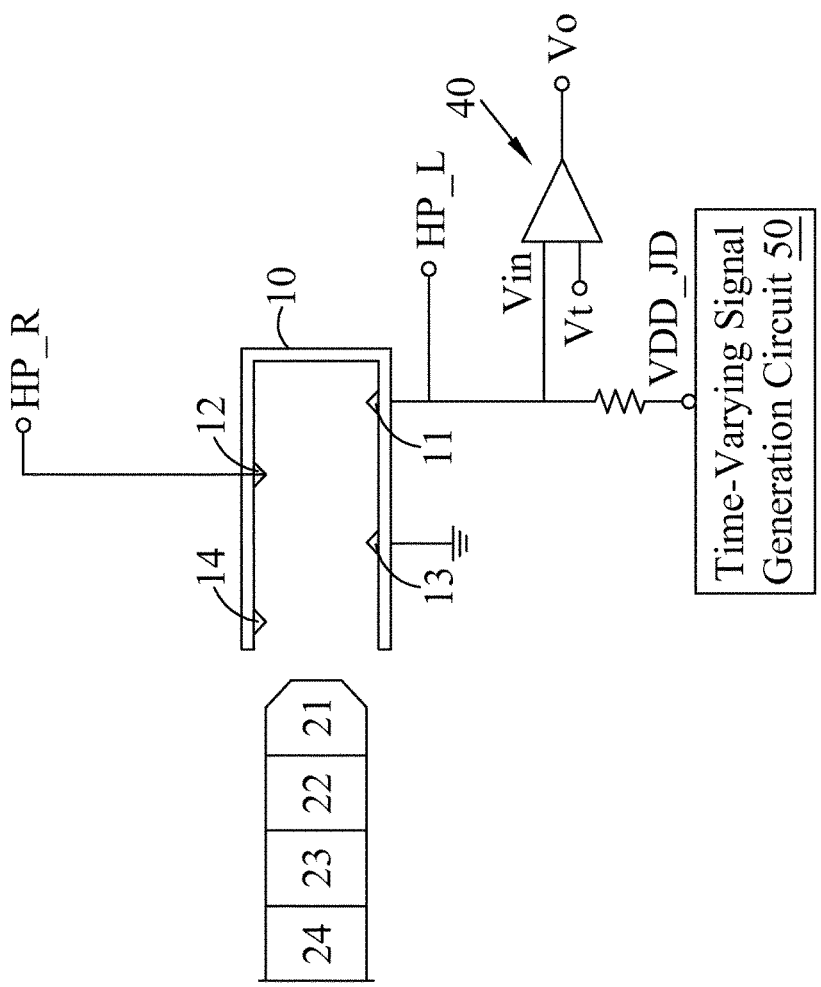
FIG. 2 is a schematic diagram showing a first embodiment of the audio plug detection structure in accordance with the present invention.

Please refer to FIG. 2 which is a schematic diagram showing a first embodiment of the audio plug detection structure in accordance with the present invention. In FIG. 2, the audio plug detection structure of the first embodiment of the present invention can be adopted to an audio jack 10 corresponding to an audio plug 20. The audio plug detection structure of this embodiment includes a plurality of connection points, a time-varying signal generation circuit 50, and a comparison circuit 40. The plurality of connection points include a first connection point 11, a second connection point 12, a third connection point 13, and a fourth connection point 14. The first connection point 11, the second connection point 12, the third connection point 13, and the fourth connection point 14 of the plurality of connection points are disposed at an inner side of the audio jack 10. In this embodiment, the audio plug is a 4-pole audio plug, and when the audio plug 20 is inserted into the audio jack 10, the first connection point 11, the second connection point 12, the third connection point 13, and the fourth connection point 14 of the plurality of connection points are one-to-one connected to a first pole point 21, a second pole point 22, a third pole point 23, and a fourth pole point 24 of a plurality of pole points of the audio plug 20. In another embodiment, the audio plug is a 3-pole audio plug, and the first connection point 11, the second connection point 12, the third connection point 13, and the fourth connection point 14 of the plurality of connection points can be multiple-to-one connected to the pole points of the 3-pole audio plug. The first connection point 11, the second connection point 12, the third connection point 13, and the fourth connection point 14 are connected to functional circuits or chip pins corresponding to the first pole point 21, the second pole point 22, the third pole point 23, and the fourth pole point 24 of the audio plug, or a ground terminals, respectively. When the audio plug 20 is inserted into the audio jack 10, the first connection point 11 is connected to the first pole point 21, and the third connection point 13 is connected to the third pole point 23 different from the first pole point 21 (here, the third connection point 13 correspond to the second connection point mentioned in "SUMMARY OF THE INVENTION" part, and the third pole point 23 correspond to the second pole point mentioned in "SUMMARY OF THE INVENTION" part,). A time-varying signal generation circuit 50 is connected to the first connection point 11, and outputs a time-varying signal VDD_JD. A comparison circuit 40 is connected to the first connection point 11, receives the time-varying signal VDDJD, and compares the time-varying signal VDD_JD with a reference signal Vt. When the audio plug 20 is inserted into the audio jack 10, the time-varying signal generation circuit 50, the first connection point 11, an inside impedance circuit of the audio plug 20, and the third connection point 13 form a loop, and the comparison circuit 40 outputs a determination signal Vo to determine the audio plug 20 is inserted into the audio jack 10 by detecting a variation of the time-varying signal VDD_JD in respect of the reference signal Vt.

Specifically, one objective of the present invention is to join the function of the connection point for detecting the audio plug (such as the detection connection point 15 of FIG. 1) to other connection points to simplify the whole circuit structure. The audio plug can be a 3-pole or 4-pole audio plug. Here, the audio plug 20 in the embodiment of FIG. 2 is a 4-pole audio plug. If the audio plug is a 3-pole plug, the third connection point 13 and the fourth connection point 14 of the audio jack may be connected to the same pole point of the audio plug, which is an example of the aforementioned "multiple-to-one connection". In the embodiment of FIG. 2, when the audio plug 20 is correctly inserted into the audio jack 10, the first connection point 11, the second connection point 12, the third connection point 13, and the fourth connection point 14 of the audio jack 10 are one-to-one connected to the first pole point 21, the second pole point 22, the third pole point 23, and the pole point 24 of the audio plug 20. The first connection point 11, the second connection point 12, the third connection point 13, and the fourth connection point 14 are connected to functional circuits or chip pins corresponding to the first pole point 21, the second pole point 22, the third pole point 23, and the fourth pole point 24 of the audio plug, or a ground terminals, respectively. For example, the first connection point 11 of the audio jack 10 corresponds to the left-channel, so the first connection point 11 is connected to a left channel output terminal HP_L of an audio chip 30 or a circuit with similar function. The second connection point 12 of the audio jack 10 corresponds to the right-channel, so the second connection point 12 is connected to a right channel output terminal HP_R of the audio chip 30 or a circuit with similar function. Similarly, the third connection point 13 and fourth connection point 14 may respectively correspond to the ground and the microphone signal, so the third connection point 13 and fourth connection point 14 of the audio jack 10 may be respectively connected to the ground terminal, and the corresponding functional circuit or the chip pin. In this embodiment, the connection relationship between the third connection point 13, the fourth connect point 14 and the rest portion of the whole circuit may be similar as the structure shown in FIG. 1.

Figure 1:
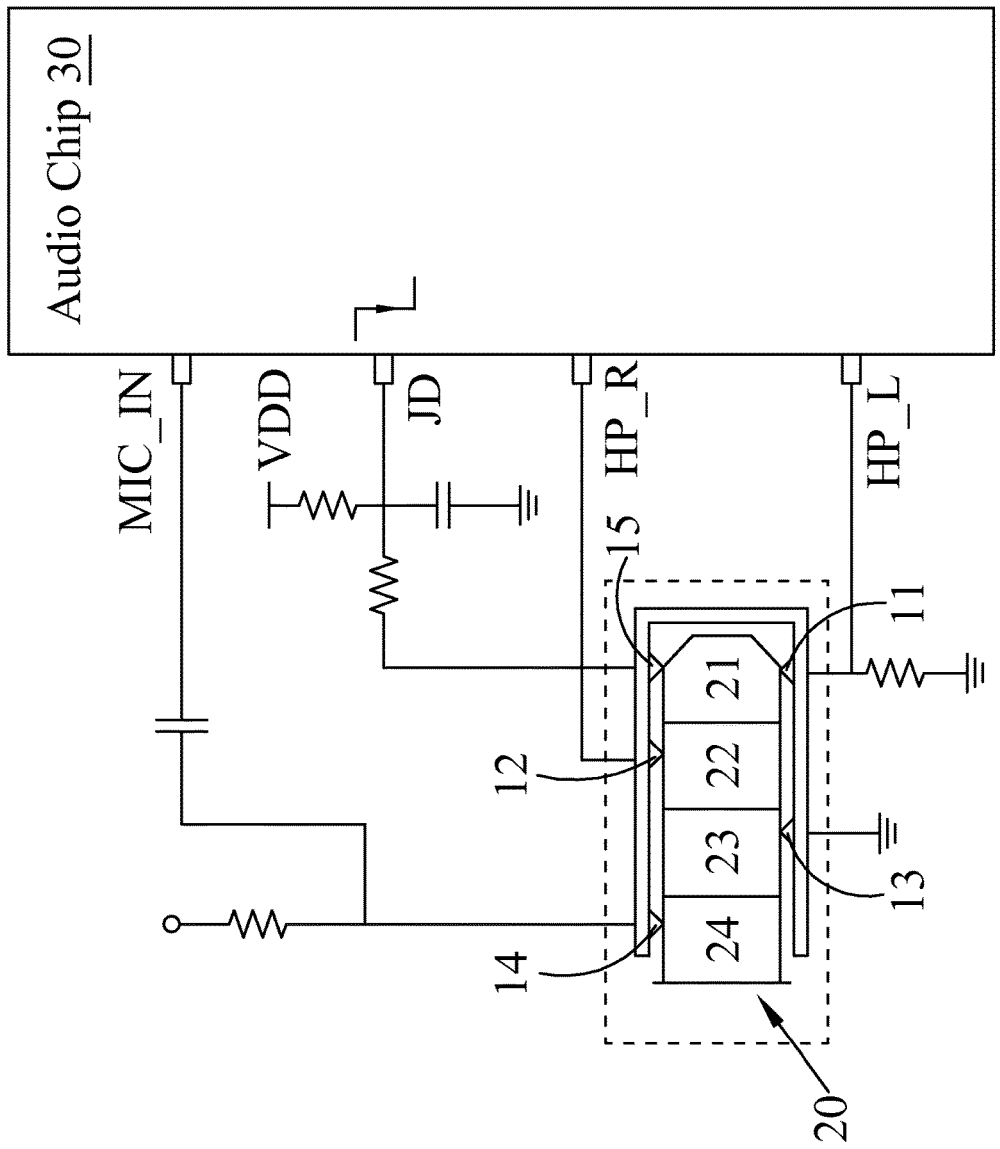
FIG. 1 is a structure view of a typical audio jack.
Figure 3:
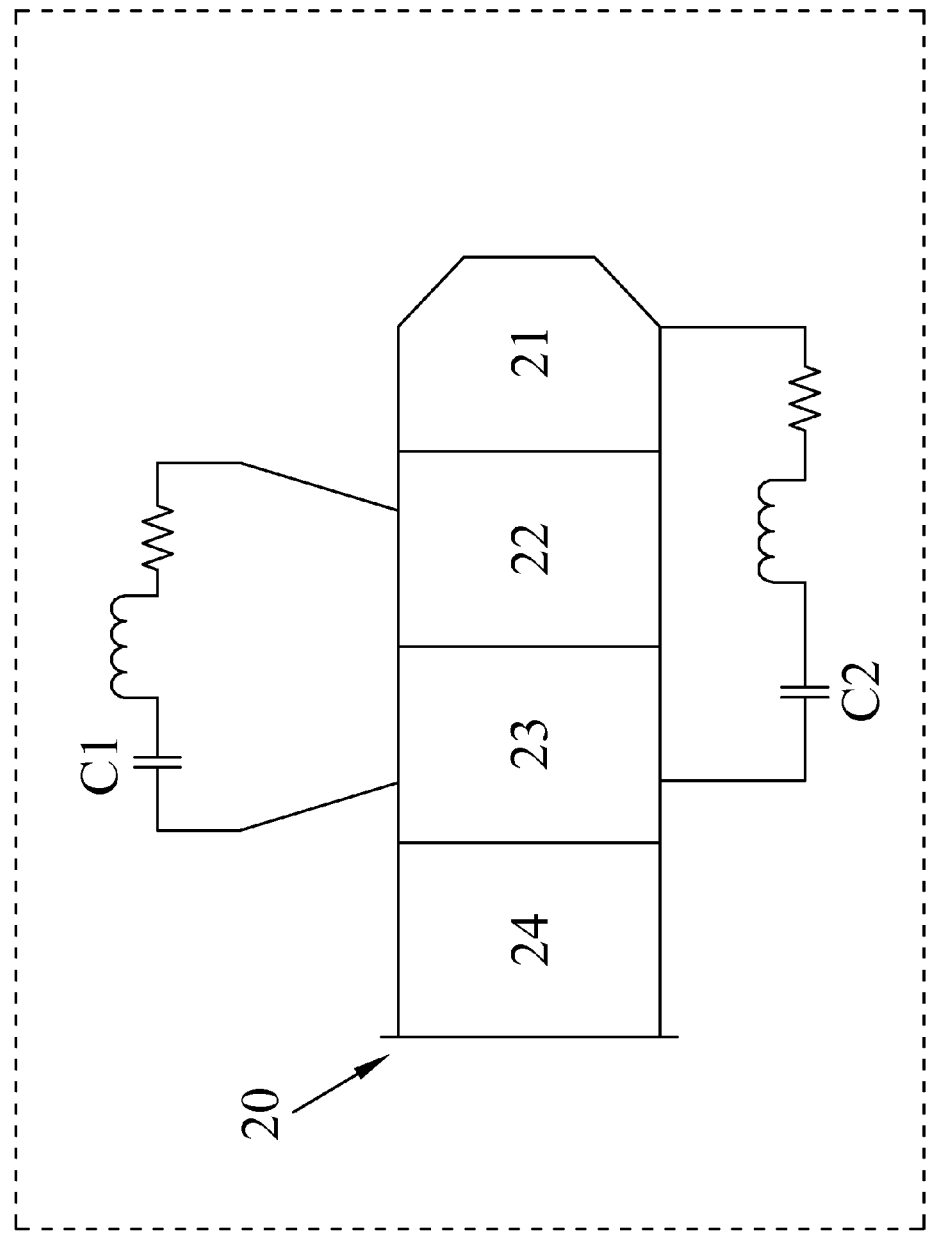
FIG. 3 is a schematic diagram showing an equivalent circuit of an inside impedance circuit of an audio plug.

Compared to the structure disclosed in FIG. 1, this embodiment joins the function of the detection connection point 15 to the first connection point 11. Therefore, in this embodiment, in addition to the left channel output terminal originally connected, the first connection point 11 is further connected to a detection circuit including the time-varying signal generation circuit 50 and the comparison circuit 40. In this embodiment, when the audio plug 20 is inserted into the audio jack 10, the detection signal for detecting whether or not the audio plug 20 is inserted not only flows through the same first pole point 21, but flows from the first pole point 21 and then flows from the first pole point 21 to the third pole point 23 to form a loop. In other words, the time-varying signal generation circuit 50, the first connection point 11, and the third connection point 13 form a loop by the inside impedance circuit of the audio plug 20. Please refer to FIG. 3, which is the schematic diagram showing an equivalent circuit of the inside impedance circuit of the audio plug 20. According to FIG. 3, the detection signal flows from the first pole point 21 to the third pole point 23. However, also according to FIG. 3, the inside impedance circuits between the first pole point and the third pole point include the capacitive property (expressed in FIG. 3 as capacitors C2). Therefore, if the detection signal is a DC signal, the inside impedance circuit of the audio plug is an open loop, for the impedance of the inside impedance circuit is infinite for DC signals. Thus, the detection signal used in embodiments of the present invention is the time-varying signal VDD_JD generated from the time-varying signal generation circuit 50. For the time-varying signal VDD_JD, a capacitor has finite impedance, and thus the equivalent impedances when the audio plug is inserted and when the audio plug is not inserted have significant difference. The time-varying signal generation circuit 50 is also connected to the comparison circuit 40, and therefore, when the audio plug 20 is inserted into the audio jack 10, a input signal Vin input from an input terminal of the comparison circuit 40 (the bias caused by the time-varying signal VDD_JD at the input terminal of the comparison circuit 40) has significant change as well. The comparison circuit 40 also has a reference signal Vt input at another input terminal, and thus the comparison circuit 40 is able to output a determination signal Vo to determine whether or not the audio plug 20 is inserted into the audio jack 10 by comparing a variation of the input signal Vin (i.e., the bias from the time-varying signal) in respect to the reference signal Vt. The time-varying signal VDD_JD generated from the time-varying signal generation circuit 50 may be a square wave, a triangular wave, a sine wave, etc. Since the circuit for generating such time-varying signals is common knowledge in the art, the detailed description is omitted here. The comparison circuit 40 can simply be a voltage comparator, or a complex circuit or a chip with similar function. Although the detection circuit including the time-varying signal generation circuit 50 and the comparison circuit 40 is connected to the first connection point 11 in this embodiment, the present invention is not limited thereto. For example, the detection circuit can be connected to the second connection point 12, and when the audio plug 20 is inserted into the audio jack 10, the time-varying signal generation circuit 50, the second connection point 12, the inside impedance circuit of the audio plug 20, and the third connection point 13 can form a loop to make the time-varying signal VDD_JD outputted from the time-varying signal generation circuit 50 to the comparison circuit 40 change. Besides, in this embodiment, some extra electronic elements can be connected to the first connection point 11, the second connection point 12, or other parts of the whole circuit to adjust the bias provided to the comparison circuit 40, and impedances (e.g., resistance or capacitance) of these extra electronic can be chosen based on the impedance value of the inside impedance circuit of the audio plug 20 to be detected in concerning the used time-varying signal VDD_JD.

Figure 4:
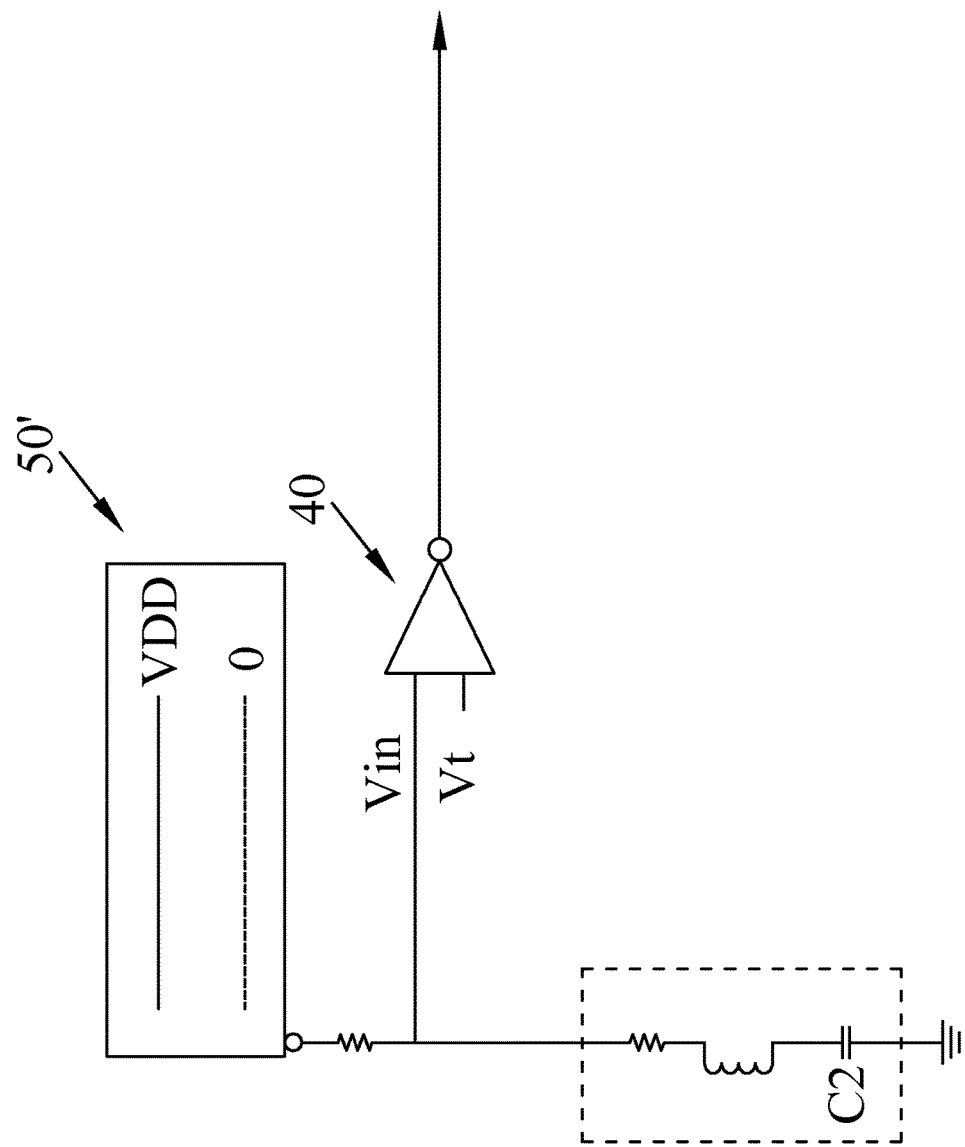
FIG. 4 is a schematic diagram showing a first comparative embodiment of the audio plug detection structure in accordance with the present invention.

Please refer to FIG. 4, which is a schematic diagram showing a first comparative embodiment of the audio plug detection structure in accordance with the present invention. The structure in FIG. 4 is similar to that of the prior mentioned embodiments of the present invention, but the detection signal outputted by the signal generation circuit 50' is a DC signal VDD. Before the audio plug 20 is inserted into the audio jack 10, an input terminal of the comparison circuit 40 (the input node for the input signal Vin) and a ground terminal are open. After the audio plug 20 is inserted into the audio jack 10, an inside impedance circuit of the audio plug 20 connect the input terminal of the comparison circuit 40 to the ground terminal. However, since the inside impedance circuit of the audio plug 20 include the capacitive property, the input terminal of the comparison circuit 40 and the ground terminal are still open for the DC signal VDD. That is, regardless of whether or not the audio plug 20 is inserted into the audio jack 10, there is almost no variation of the voltage applied at the input terminal of the comparison circuit 40. Therefore, the structure of the first comparative embodiment cannot detect whether or not the audio plug 20 is inserted into the audio jack 10.

Figure 5:
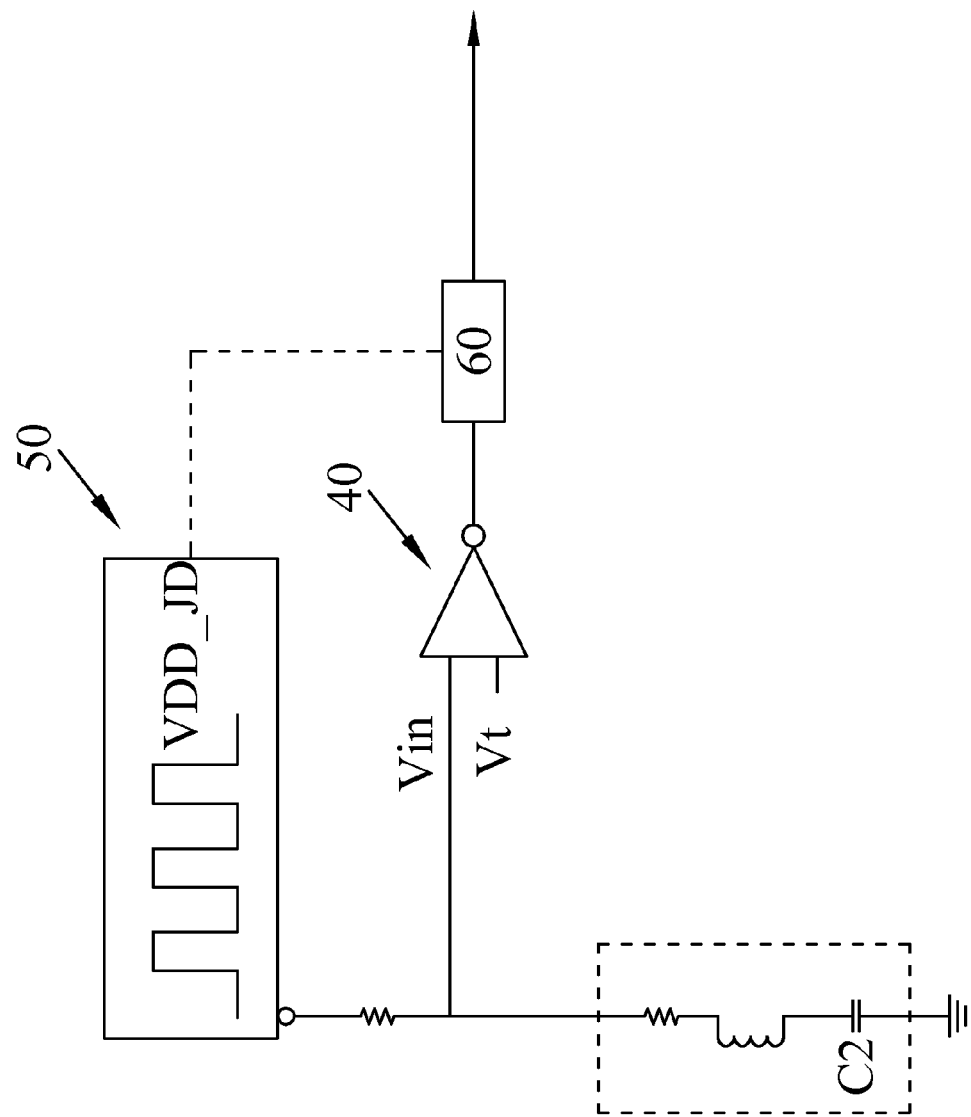
FIG. 5 is a schematic diagram showing a second embodiment of the audio plug detection structure in accordance with the present invention.

Please refer to FIG. 5, which is a schematic diagram showing a second embodiment of the audio plug detection structure in accordance with the present invention. In FIG. 5, the detection signal used by the audio plug detection structure is the time-varying signal VDD_JD. Specifically, the time-varying signal VDD_JD may be a square wave signal and a duty cycle of the square wave signal may be modulatable.

In particular, the square wave is preferably used as the time-varying signal VDD_JD to detect whether or not the audio plug 20 is inserted into the audio jack 10. The duty cycle of the square wave is preferably modulatable. In order to achieve this objective, the time-varying signal generation circuit 50 of the audio plug detection structure of this embodiment may receive a modulation signal from the outside to adjust the duty cycle of the time-varying signal VDD_JD while outputting the time-varying signal VDD_JD. Since the electricity is consumed as the output of the time-varying signal VDD_JD is "high", the modulation signal received by the time-varying signal generation circuit 50 can not only adjust the duty cycle of the time-varying signal VDD_JD as short as possible, but also ensure that the duty cycle of the time-varying signal VDD_JD is long enough to accurately detect the insertion of the audio plug 20, and thereby the optimization of the electricity cost can be obtained. In one embodiment, the time-varying signal generation circuit 50 and the input terminal for the modulation signal can be disposed in the same circuit or packaged in the same chip.

In addition, in FIG. 5, the audio plug detection structure may further include a time control circuit 60. The time control circuit 60 is connected to the output of the comparison circuit 40 and the time-varying signal generation circuit 50. The time control circuit 60 can control the duty cycle of the time-varying signal VDD_JD (i.e., the time control circuit 60 can output the aforementioned modulation signal), receive a feedback signal from the time-varying signal generation circuit 50 to generate a latch signal, and sample the determination signal outputted from the comparison circuit 40 as the output of the time-varying signal is "high" according to the latch signal.

Figure 6:
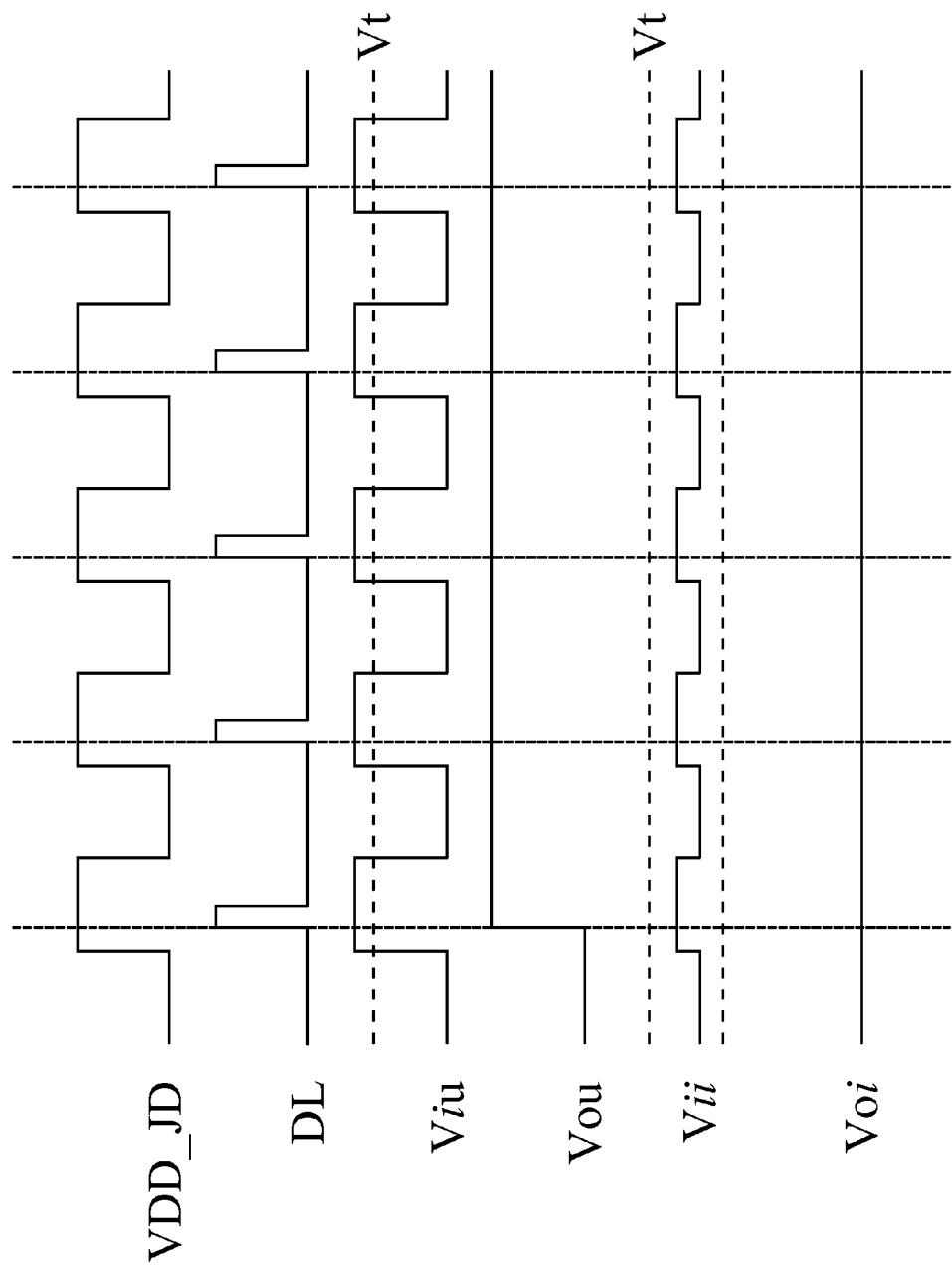
FIG. 6 is an oscillograph showing waveforms at each point of the second embodiment of the audio plug detection structure in accordance with the present invention.

To further provide the accuracy for detection and determination, the time control circuit 60 may be connected to the time-varying signal generation circuit. The time control circuit 60 controls the duty cycle of the time-varying signal VDD_JD outputted in a square waveform, receives the feedback signal, which is relating to the output of the time-varying signal VDD_JD, from the time-varying signal generation circuit 50, and generates the latch signal according to the feedback signal. Subsequently, according to the generated latch signal, the time control circuit 60 can sample the determination circuit from the comparison circuit 40 only if the output of the time-varying signal generated from the time-varying signal generation circuit 50 is "high". In particular, please refer to FIG. 6, which is an oscillograph showing waveforms at each point of the second embodiment of the audio plug detection structure in accordance with the present invention. In FIG. 6, the time-varying signal generation circuit 50 may output the time-varying signal VDD_JD with a predetermined duty cycle. The time control circuit 60 may generate the latch signal DL according to the feedback signal from the time-varying signal generation circuit 50, and the latch signal may be a square wave with a shorter duty cycle than the time-varying signal VDD_JD. The timing for the time control circuit 60 to sample the determination signal can be set as the timing when the latch signal DL changes from "low" to "high" (i.e., the rising edge of the latch signal DL). The rising edge of the latch signal DL can correspond to the period when the time-varying signal is "high". In FIG. 6, the signal Viu is the signal applied at the input terminal of the comparison circuit 40 when the audio plug 20 is not inserted into the audio jack 10, and the signal Vou is the signal outputted from the time control circuit 60 after the time control circuit 60 samples the determination signal outputted from the comparison circuit 40 corresponding to the signal Viu. At each of the sampling timings of the time control circuit 60 (expressed as vertical dashed lines in FIG. 6), the voltage value of the signal Viu is higher than that of the reference signal Vt, so the signal Vou keeps "high" after the first sampling timing Thus, it can be determined that the audio plug 20 is not inserted into the audio jack 10 yet. In contrast, the signal Vii is the signal applied at the input terminal of the comparison circuit 40 when the audio plug 20 is inserted into the audio jack 10, and the signal Voi is the signal outputted from the time control circuit 60 after the time control circuit 60 samples the determination signal outputted from the comparison circuit 40 corresponding to the signal Vii. At each of the sampling timings of the time control circuit 60 (expressed as vertical dashed lines in FIG. 6), the voltage value of the signal Vii is lower than that of the reference signal Vt, so the signal Voi keeps "low" after the first sampling timing. Thus, it can be determined that the audio plug 20 has been inserted into the audio jack 10. In one embodiment, the input terminal of the time control circuit 60 may be connected to the detection terminal JD of the audio chip 30 (please refer to FIG. 1). When a transition in the output of the time control circuit 60 from "high" to "low" occurs, the logic set in the audio chip 30 can determine that the audio plug 20 is inserted into the audio jack 10.

Figure 7:
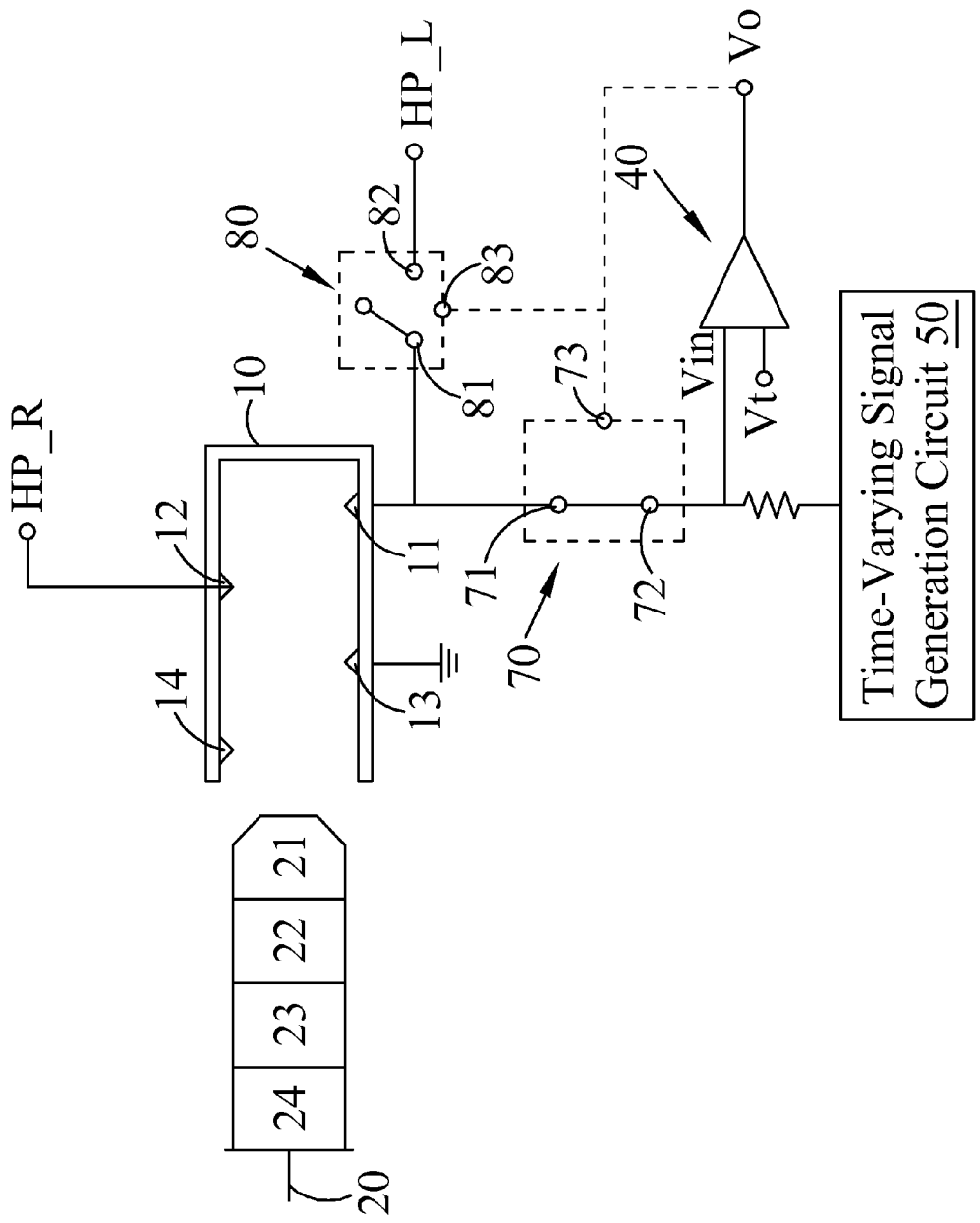
FIG. 7 is a schematic diagram showing a third embodiment of the audio plug detection structure in accordance with the present invention.

Please refer to FIG. 7, which is a schematic diagram showing a third embodiment of the audio plug detection structure in accordance with the present invention. In FIG. 7, the audio plug detection structure may further include a first switch 70 and a second switch 80. The first switch 70 includes a first terminal 71, a second terminal 72, and a first control terminal 73. The first terminal 71 is connected to the first connection point 11, the second terminal 72 is connected to the time-varying signal generation circuit 50 and the comparison circuit 40, and the first control terminal 73 is connected to the comparison circuit 40. The second switch 80 includes a third terminal 81, a fourth terminal 82, and a second control terminal 83. The third terminal 81 is connected to the first connection point 11, the fourth terminal 82 is connected to the functional circuit or the chip pin corresponding to the first pole point 21 or the ground terminal, and the second control terminal 83 connected to the comparison circuit 40. After a predetermined time since the determination signal Vo is outputted, the comparison circuit 40 outputs a switch signal to the first control terminal 73 and the second control terminal 83. The first terminal 71 and the second terminal 72 of the first switch 70 are open according to the switch signal. The third terminal 81 and the fourth terminal 82 of the second switch 80 are closed according to the switch signal.

In particular, before the audio plug 20 is inserted into the audio jack 10, the first terminal 71 and the second terminal 72 of the first switch 70 can keep being closed (short-circuited), and the third terminal 81 and the fourth terminal 82 of the second switch 80 can keep being open (open-circuited). Thus, the functional circuit (the left-channel output terminal HP_L in this embodiment) is not connected to the time-varying signal generation circuit 50 and the comparison circuit 40, and the error due to the interference caused by a left channel signal outputted from the left-channel output terminal HP_L into the comparison circuit 40 will not occur. After the audio plug 20 is inserted into the audio jack 10, the comparison circuit 40 can output a switch signal to the first control terminal 73 of the first switch 70 and the second control terminal 83 of the second switch 80. According to the switch signal, the first switch 70 can make the first terminal 71 and the second terminal 72 be open-circuited, and the second switch 80 can make the third terminal 81 and the fourth terminal 82 be closed-circuited. Therefore, the sound transmission function of the audio plug 20 can be correctly performed, and time-varying signal VDD_JD generated from the time-varying signal generation circuit 50 should not be misinterpreted as the left channel signal. What should be noted is, although the switch signal is outputted from the comparison circuit 40 in this embodiment, the present invention is not limited thereto. For example, the output terminal of the comparison circuit 40 may be connected to an input terminal of a chip, and the chip may generate the switch signal to control the connection conditions of the first switch 70 and the second switch 80. Besides, in one embodiment, the fourth connection point 14 and the circuit connected thereto may have the function to detect whether or not the audio plug 20 is pulled out from the audio jack 10, and output a reset signal to the first switch 70 and the second switch 80. According to the reset signal, the first switch 70 and the second switch 80 can reset their connection conditions for the situation that the audio plug 20 is not inserted into the audio jack 10.

Preferably, the third connection point 13 is connected to the ground terminal Therefore, the connection between the loop formed for the detection signal and other functional circuits can be decreased, and the possibility of interference can be further reduced.

Please refer to FIG. 2 or FIG. 7 again. In FIGS. 2 and 7, compared to the other connection points (the second connection point 12, the third connection point 13, and the fourth connection point 14), the first connection point 11 may be disposed at an innermost side of the inside of the audio jack 10.

In operation, when the audio plug 20 and the audio jack 10 are correctly operated to transmit sound, the relative position between the audio plug 20 and the audio jack 10 should be the position where the first connection point 11 of the audio jack 10 is connected to the first pole point 21 of the audio plug 20. To ensure that the audio plug 20 and the audio jack 10 can be correctly operated as the audio plug detection structure detect the audio plug 20 is inserted into the audio jack 10, the first connection point 11 connected to the detection circuit may be disposed at an innermost side of the inside of the audio jack 10 with relation to the other connection points. Therefore, each functional circuit can be prevented from outputting sound signals to the audio plug 20 when the audio plug is not completely or correctly inserted into the audio jack 10, and the dissipated electricity consumption can be further reduced in the whole circuit structure.

Figure 8:
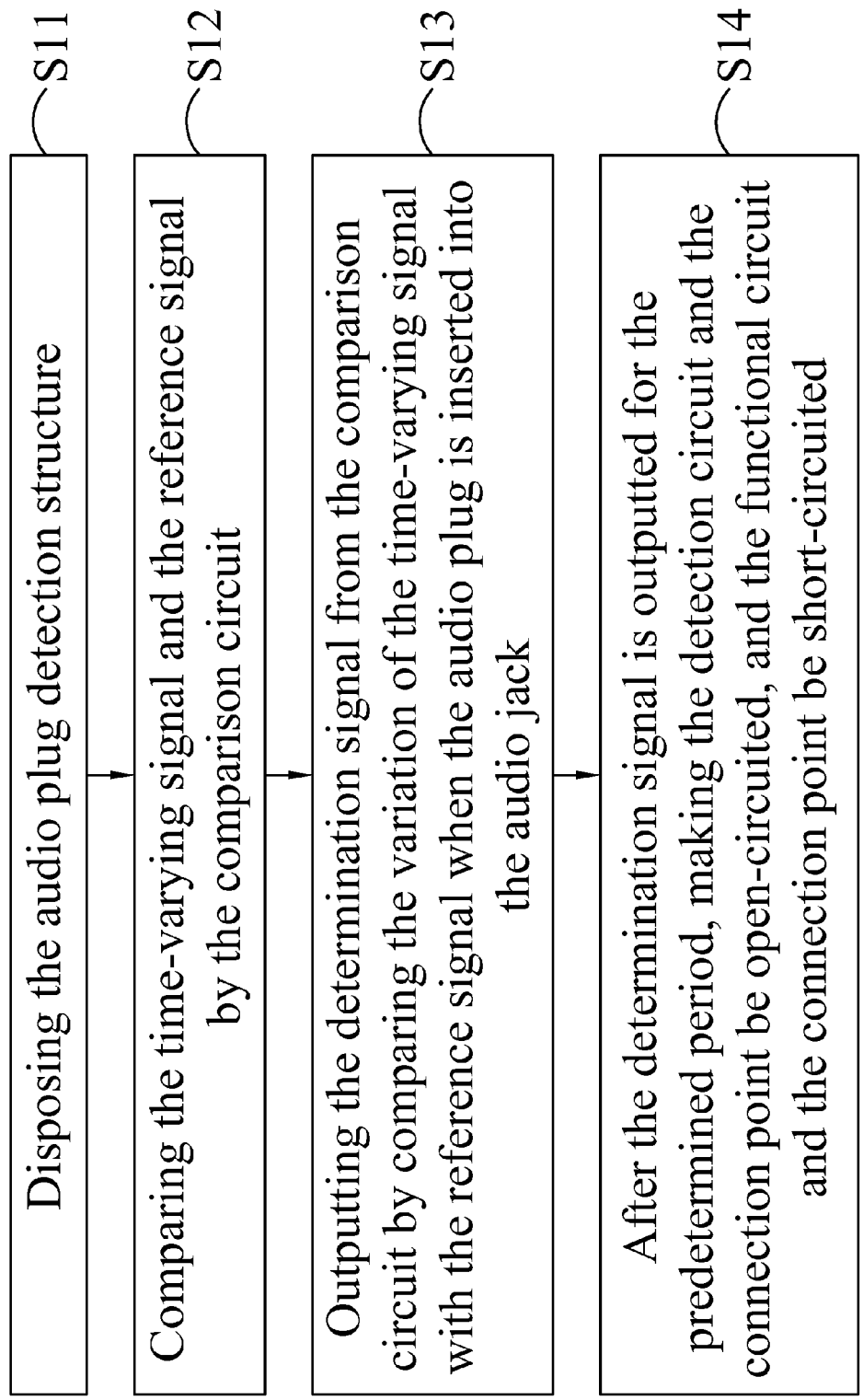
FIG. 8 is a flowchart showing a fourth embodiment of the audio plug detection method in accordance with the present invention.

Please refer to FIG. 8, which is a flowchart showing a fourth embodiment of the audio plug detection method in accordance with the present invention. In FIG. 8, the step S11 is the step of disposing the audio plug detection structure, where the audio plug detection structure can be any of the audio plug detection structures shown in FIGS. 2, 5, and 7 or defined by the appended claims of the present invention. Since each of the elements and the relation therebetween have been described, the detailed description is omitted here. In the step S12, comparing the time-varying signal and the reference signal. Here, the time-varying signal to be compared means the signal applied to the input terminal of the comparison circuit, and the reference signal may be a DC bias as shown in FIG. 6. In the step S13, when the audio plug is inserted into the audio jack, outputting the determination signal by comparing the variation of the time-varying signal with the reference signal. After the audio plug is inserted into the audio jack, the time-varying signal applied at the input terminal of the comparison circuit varies due to the change of the output impedance for the time-varying signal generation circuit. Generally, so-called "variation of the time-vary signal" may mean the voltage magnitude of the time-varying signal change from higher than the reference signal to lower than the reference signal, but the present invention is not limited thereto. If the audio plug detection structure disposed in the step S11 is that of FIG. 7 or similar structures, the audio plug detection method may further include the step S14. In step S14, when the determination signal is outputted for a predetermined time, according to the switch signal, the detection circuit (including the time-varying signal generation circuit and the comparison circuit) and the connection point are open, and the functional circuit (or the chip pins) corresponding to the pole point of the audio plug or the ground terminal are closed (short). Here, the predetermined time can prevent the audio plug detection structure from being damaged due to the action of plugging in an out the audio plug in short time, and therefore the reliability can be increased.

While the means of specific embodiments in present invention has been described by reference drawings, numerous modifications and variations could be made thereto by those skilled in the art without departing from the scope and spirit of the invention set forth in the claims. The modifications and variations should in a range limited by the specification of the present invention.

What is claimed is:

1. An audio plug detection structure, applicable to an audio jack corresponding to an audio plug, comprising:
    a plurality of connection points, disposed on an inner side of the audio jack, one-to-one or multiple-to-one connected to a plurality of pole points of the audio plug when the audio plug is inserted into the audio jack, wherein each of the plurality of connection points is connected to a functional circuit or a chip pin corresponding to each of the plurality of pole points of the audio plug or a ground terminal, the plurality of connection points comprise a first connection point and a second connection point, and when the audio plug is inserted into the audio jack, the first connection point is connected to a first pole point of the plurality of pole points, and the second connection point is connected to a second pole point of the plurality of pole points, wherein the second pole point is different from the first pole point;
    a time-varying signal generation circuit, connected to the first connection point and configured to generate and output a time-varying signal which flows to the second connection point of the audio jack from the first connection point of the audio jack through an inside impedance circuit formed between the first pole point and the second pole point in response to the audio plug being inserted into the audio jack; and
    a comparison circuit, connected to the first connection point and receiving the time-varying signal, and comparing the time-varying signal with a reference signal;
    wherein when the audio plug is inserted into the audio jack, the time-varying signal generation circuit, the first connection point, an inside impedance circuit between the first pole point and the second pole point of the audio plug, and the second connection point form a loop, and the comparison circuit outputs a determination signal to determine the audio plug is inserted into the audio jack by comparing a variation of the time-varying signal with the reference signal;
    wherein the determination signal changes in response to the time-varying signal flowing to the second connection point of the audio jack from the first connection point of the audio jack through the inside impedance circuit in response to the audio plug being inserted into the audio jack.

2. The audio plug detection structure of claim 1, wherein the time-varying signal is a square wave signal, and a duty cycle of the square wave signal is modulatable.

3. The audio plug detection structure of claim 2, further comprising:
    a time control circuit, connected to an output terminal of the comparison circuit and the time-varying signal generation circuit, wherein the time control circuit controls the duty cycle, generates a latch signal according to a feedback signal from the time-varying signal generation circuit, and when the time-varying signal is high, samples the determination signal outputted from the comparison circuit according to the latch signal.

4. The audio plug detection structure of claim 1, further comprising:
    a first switch, comprising a first terminal, a second terminal, and a first control terminal, wherein the first terminal is connected to the first connection point, the second terminal is connected to the time-varying signal generation circuit and the comparison circuit, and the first control terminal is connected to the comparison circuit; and
    a second switch, comprising a third terminal, a fourth terminal, and a second control terminal, wherein the third terminal is connected to the first connection point, the fourth terminal is connected to the functional circuit or the chip pin corresponding to the first pole point or the ground terminal, and the second control terminal connected to the comparison circuit,
wherein after a predetermined time since the determination signal is outputted, the comparison circuit outputs a switch signal to the first control terminal and the second control terminal, the first terminal and the second terminal of the first switch are open according to the switch signal, and the third terminal and the fourth terminal of the second switch are closed according to the switch signal.

5. The audio plug detection structure of claim 1, wherein with relation to the other connection points, the first connection point is disposed at an innermost side of the inner side of the audio jack.

6. The audio plug detection structure of claim 1, wherein the second connection point is connected to the ground terminal.

7. An audio plug detection method, applicable to an audio jack corresponding to an audio plug, comprising:
providing a plurality of connection points to an inner side of the audio jack, wherein the plurality of connection points are one-to-one or multiple-to-one connected to a plurality of pole points of the audio plug when the audio plug is inserted into the audio jack, each of the plurality of connection points is connected to a functional circuit or a chip pin corresponding to each of the plurality of pole points of the audio plug or a ground terminal, the plurality of connection points comprise a first connection point and a second connection point, and when the audio plug is inserted into the audio jack, the first connection point is connected to a first pole point of the plurality of pole points, and the second connection point is connected to a second pole point of the plurality of pole points, wherein the second pole point is different from the first pole point;
connecting a time-varying signal generation circuit to the first connection point, the time-varying generation circuit configured to generate and output a time-varying signal which flows to the second connection point of the audio jack from the first connection point of the audio jack through an inside impedance circuit formed between the first pole point and the second pole point in response to the audio plug being inserted into the audio jack;
connecting a comparison circuit to the first connection point and the time-varying signal generation circuit to make the comparison circuit receive the time-varying signal;
comparing the time-varying signal with a reference signal by the comparison circuit;
forming a loop by the time-varying signal generation circuit, the first connection point, an inside impedance circuit between the first pole point and the second pole point of the audio plug, and the second connection point when the audio plug is inserted into the audio jack; and outputting a determination signal to determine the audio plug is inserted into the audio jack from the comparison circuit by comparing a variation of the time-varying signal with the reference signal;
wherein the determination signal changes in response to the time-varying signal flowing to the second connection point of the audio jack from the first connection point of the audio jack through the inside impedance circuit in response to the audio plug being inserted into the audio jack.

8. The audio plug detection method of claim 7, wherein the time-varying signal is a square wave signal, and a duty cycle of the square wave signal is modulatable.

9. The audio plug detection method of claim 8, further comprising:
connecting a time control circuit to the time-varying signal generation circuit and an output terminal of the comparison circuit;
controlling the duty cycle by the time control circuit;
generating a latch signal by the time control circuit according to a feedback signal from the time-varying signal generation circuit; and
sampling the determination signal outputted from the comparison circuit by the time control circuit according to the latch signal.

10. The audio plug detection method of claim 7, further comprising:
connecting a first terminal of a first switch to the first connection point;
connecting a second terminal of the first switch to the time-varying signal generation circuit and the comparison circuit;
connecting a first control terminal of the first switch to the comparison circuit;
connecting a third terminal of a second switch to the first connection point;
connecting a fourth terminal of the second switch to the functional circuit or the chip pin corresponding to the first pole point or the ground terminal;
connecting a second control terminal of the second switch to the comparison circuit;
outputting a switch signal by the comparison circuit to the first control terminal and the second control terminal after a predetermined time since the determination signal is outputted;
opening the first terminal and the second terminal of the first switch according to the switch signal; and
closing the third terminal and the fourth terminal of the second switch according to the switch signal.

11. The audio plug detection method of claim 7, wherein with relation to the other connection points, the first connection point is disposed at an innermost side of the inner side of the audio jack.

12. The audio plug detection method of claim 7, wherein the second connection point is connected to the ground terminal.

* * * * *